(12) United States Patent
Lee et al.

(10) Patent No.: US 12,366,719 B2
(45) Date of Patent: Jul. 22, 2025

(54) HEAD-MOUNTED DISPLAY DEVICE AND DISPLAY METHOD THEREFOR

(71) Applicant: HTC Corporation, Taoyuan (TW)

(72) Inventors: Jeo-Yi Lee, Taoyuan (TW); Yueh-Ting Chung, Taoyuan (TW)

(73) Assignee: HTC Corporation, Taoyuan (TW)

( * ) Notice: Subject to any disclaimer, the term of this patent is extended or adjusted under 35 U.S.C. 154(b) by 449 days.

(21) Appl. No.: 17/994,018

(22) Filed: Nov. 25, 2022

(65) Prior Publication Data

US 2023/0418017 A1 Dec. 28, 2023

Related U.S. Application Data

(60) Provisional application No. 63/356,049, filed on Jun. 28, 2022.

(51) Int. Cl.
*G02B 7/02* (2021.01)
*H05K 5/02* (2006.01)

(52) U.S. Cl.
CPC ............ *G02B 7/02* (2013.01); *H05K 5/0217* (2013.01)

(58) Field of Classification Search
CPC .... G02B 7/02; G02B 7/04; G02B 2027/0178; G02B 27/0176; G02B 27/04; G02C 7/081; G02C 7/08; G02C 7/02; G06F 1/163; H05K 5/0217

USPC ................................................... 359/813, 703
See application file for complete search history.

(56) References Cited

U.S. PATENT DOCUMENTS

| | | | |
|---|---|---|---|
| 11,307,415 B1* | 4/2022 | Sharma | G02B 3/14 |
| 11,693,262 B1* | 7/2023 | Smyth | G02B 7/023 |
| | | | 351/159.01 |
| 2014/0254026 A1* | 9/2014 | Saeedi | H04N 23/55 |
| | | | 359/708 |
| 2017/0269353 A1* | 9/2017 | Xu | G02B 30/34 |
| 2019/0265514 A1* | 8/2019 | Richards | G02C 7/022 |
| 2019/0369383 A1* | 12/2019 | Nguyen | G02B 26/004 |

FOREIGN PATENT DOCUMENTS

CN 108886610 11/2018

OTHER PUBLICATIONS

"Office Action of Taiwan Counterpart Application", issued on Sep. 4, 2023, p. 1-p. 7.

* cited by examiner

*Primary Examiner* — William R Alexander
(74) *Attorney, Agent, or Firm* — JCIPRNET

(57) ABSTRACT

A head-mounted display device includes a display, a lens group and an actuator. The display is used for generating an image light beam. The lens group is disposed between the display and a target area and is adapted to focus the image light beam to form a display image in the target area. The actuator is coupled to the display or the lens group to periodically move the display or the lens group on a plane.

12 Claims, 5 Drawing Sheets

HEAD-MOUNTED DISPLAY DEVICE AND DISPLAY METHOD THEREFOR

CROSS-REFERENCE TO RELATED APPLICATION

This application claims the priority benefit of U.S. provisional application Ser. No. 63/356,049, filed on Jun. 28, 2022. The entirety of each of the above-mentioned patent applications is hereby incorporated by reference herein and made a part of this specification.

BACKGROUND

Technical Field

The disclosure relates to a display device and a display method, and in particular, to a head-mounted display device and display method therefor.

Description of Related Art

For various head-mounted display devices of virtual reality (VR) and augmented reality (AR), the resolution of the display is the main reason affecting the sense of immersion and visual effects. The display can have a plurality of pixels, and each pixel includes a red display area, a green display area and a blue display area. Based on the size of the pixels, there may be non-luminous areas between adjacent pixels, and these non-luminous areas can be used to set corresponding control elements. If the resolution of the display of the head-mounted display device is relatively low, the visual experience of the user of the head-mounted display device will be affected by the above-mentioned non-luminous area, resulting in a so-called screen door effect.

SUMMARY

The application provides a head-mounted display device and display method therefor, which can reduce screen door effect.

A head-mounted display device of the invention includes a display, a lens group and an actuator. The display is used for generating an image light beam. The lens group is disposed between the display and a target area and is adapted to focus the image light beam to form a display image in the target area. The actuator is coupled to the display or the lens group to periodically move the display or the lens group on a plane.

A display method of the invention includes providing a display for generating an image light beam; providing a lens group disposed between the display and a target area and the lens group is adapted to focus the image light beam to form a display image in the target area; and providing an actuator for periodically moving the display or the lens group on a plane.

Based on the above, in the head-mounted display device of the invention, the display or the lens group is periodically moved on the plane through the actuator to reduce the impact of the non-luminous area on the user's visual effect and reduce the screen door effect.

Although the present application has been disclosed as above with embodiments, it is not intended to limit the present application, any person with ordinary knowledge in the technical field, without departing from the spirit and scope of the present application, can make some changes. Therefore, the protection scope of the present application shall be determined by the scope of the claims.

DESCRIPTION OF THE EMBODIMENTS

Figure 1A:
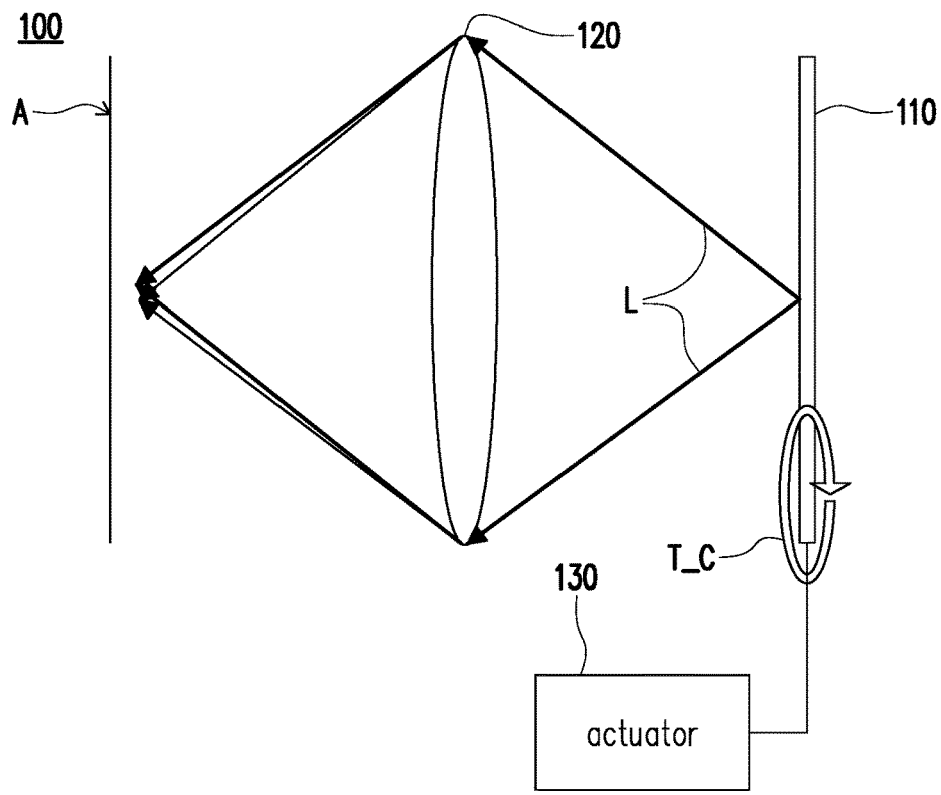
FIGS. 1A and 1B are schematic diagrams illustrating a head-mounted display device according to an embodiment of the invention.
Figure 1B:
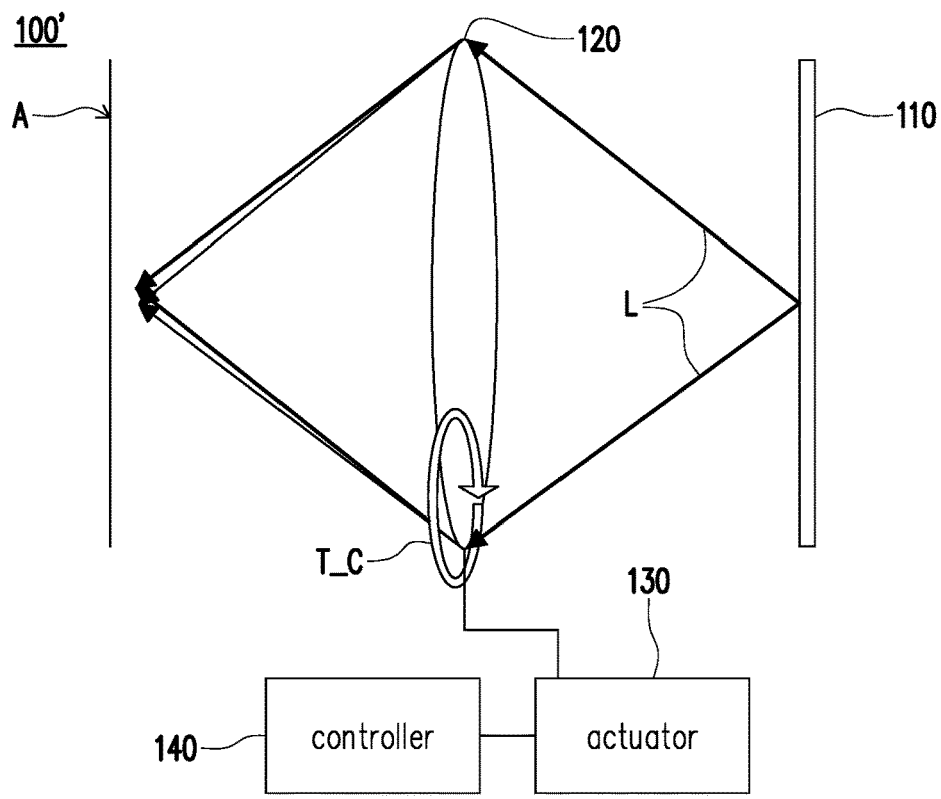

FIG. 1A is a schematic diagram illustrating a head-mounted display device according to an embodiment of the invention. The head-mounted display device 100 is used for generating display effects of virtual reality, augmented reality or mixed reality. In the embodiment, the head-mounted display device 100 includes a display 110, a lens group 120 and an actuator 130. The lens group 120 is disposed between the display 110 and a target area A, and the actuator 130 is coupled to the display 110. Wherein, the display 110 is used for generating an image light beam L, and projecting the image light beam L to the lens group 120. The lens group 120 is adapted to focus the image light beam L to form a display image in the target area A. Wherein, the target area A may correspond to the eyeball position of the user.

On the other hand, the actuator 130 is used for driving the display 110, and makes the display 110 move periodically on a plane. The above-mentioned plane may be parallel to the viewing plane of the user. In detail, the actuator 130 can make the display 110 move on a plane through a preset trajectory T_C. In the embodiment, the trajectory T_C is for example a circular trajectory. By making the display 110 perform the above periodic movement, the visual impact caused by the non-display area in the user's visual experience can be effectively reduced, and the screen door effect can be reduced.

It should be noted that, the actuator 130 can move the display 110 according to a frame period of the display 110. For example, the period that the display 110 moves along the trajectory T_C can be a frame period of the display 110, or, the frequency that the display 110 moves along the trajectory T_C can be a positive integer multiple of a frame frequency of the display 110. The amplitude of the movement of the display 110 on the plane can be determined according to the distance between two adjacent pixels in the display 110. Specifically, in a calibration stage, the designer can make the display 110 move according to different amplitudes, and actually measure the condition of the screen door effect, so as to select a better amplitude of the display 110.

By the way, in the embodiment, the actuator 130 can be a motor or a piezoelectric element. The display 110 can be any form of display without fixed limitation.

FIG. 1A is a schematic diagram illustrating a head-mounted display device according to another embodiment of the invention. Different from the head-mounted display device 100 of FIG. 1A, the actuator 130 of the head-mounted display device 100' is coupled to the lens group 120. The actuator 130 is used to drive the lens group 120 to move on the plane through the preset trajectory T_C. Here, by making the lens group 120 move periodically on the plane, the effect of reducing the screen door effect can also be achieved.

By the way, in the embodiment, the head-mounted display device 100' further includes a controller 140. The controller 140 is coupled to the actuator 130 and used to generate a driving signal to drive the actuator 130.

The controller 140 can be a processor with computing power. Or, the controller 140 can be designed through Hardware Description Language (HDL) or any other digital circuit design methods known to those skilled in the art, and can be a hardware circuit implemented by Field Programmable Gate Array (FPGA), Complex Programmable Logic Device (CPLD) or Application-specific Integrated Circuit (ASIC).

Figure 2:
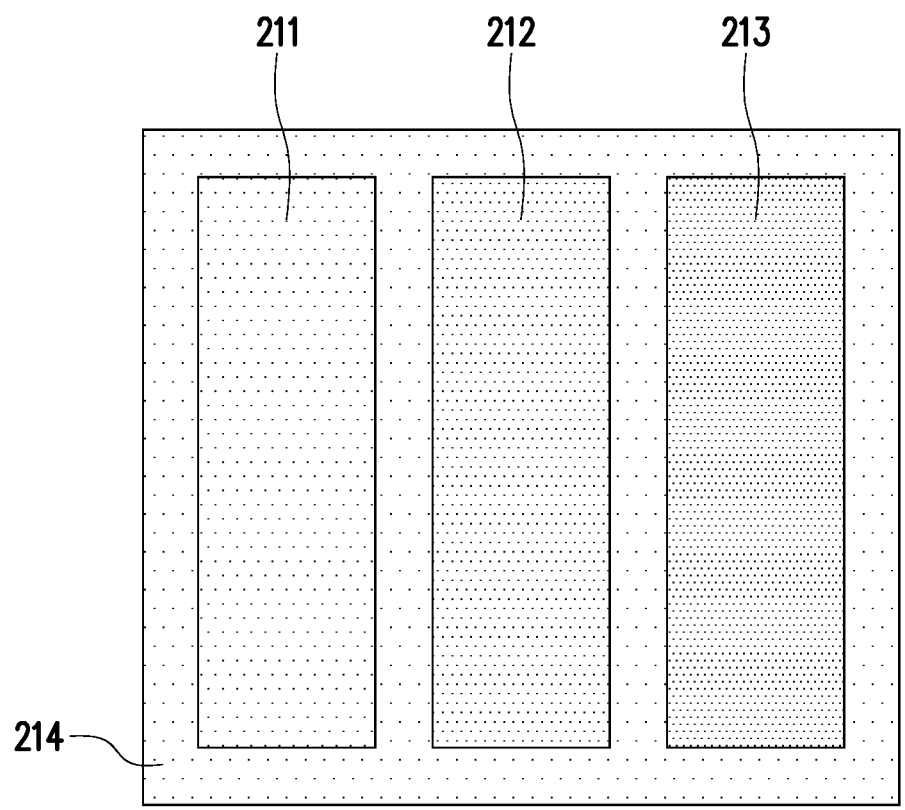
FIG. 2 is a schematic diagram of pixels according to an embodiment of the invention.

Referring to FIG. 2 below, FIG. 2 is a schematic diagram illustrating a pixel structure of a display in a head-mounted display device according to an embodiment of the invention. The pixel structure 200 includes a first color display area 211, a second color display area 212, a third color display area 213 and a non-display area 214. The first color display area 211, the second color display area 212 and the third color display area 213 are adjacently distributed, but no two of them are in direct contact. The non-display area 214 is located around the first color display area 211, the second color display area 212, and the third color display area 213, and in the spaces between them.

In the embodiment, the above-mentioned first color display area 211, second color display area 212, and third color display area 213 are, for example, a red display area, a green display area, and a blue display area, respectively. In other embodiments, the first color display area 211, the second color display area 212, and the third color display area 213 may also be any other color display areas, and there is no specific limitation.

Figure 3A:
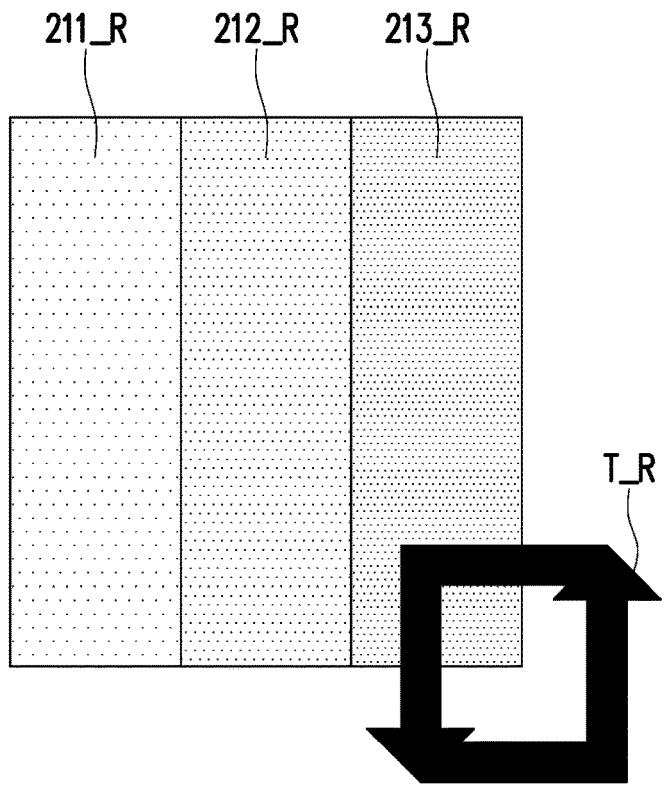
FIG. 3A to FIG. 3D are schematic diagrams of pixels seen in a target area under the periodic movement of the display or the lens group according to an embodiment of the invention.

Referring to FIG. 2 and FIG. 3A to FIG. 3D synchronously below, wherein FIG. 3A to FIG. 3D respectively depicts a schematic diagram of the display screen under the periodic movement of the display or the lens group according to the embodiment of the present invention. In FIG. 3A to FIG. 3D, the display images generated by a single pixel are taken as an example. As shown in FIG. 3A, the actuator can make the display or the lens group move periodically on the plane along the rectangular trajectory T_R. The actuator can make the display 110 or the lens group 120 move on the plane with a frequency equal to an integer multiple of a frame frequency, so that the image of the sub-display area in the pixel is effectively reduced in the display screen. Besides, the controller may determine the vertical and horizontal amplitudes of the rectangular trajectory T_R according to the distance between two adjacent pixels in the display image, and make the first color image 211_R generated by the first color display area 211 can be enlarged; make the second color image 212_R generated by the second color display area 212 can be enlarged; and make the third color image 213_R generated by the third color display area 213 can be enlarged. In addition, the image generated by the non-display area 214 in the display image can be reduced, effectively reducing the screen door effect.

The rectangular trajectory T_R in the embodiment can be a square trajectory or a rectangular trajectory, and there is no certain limitation.

Figure 3B:
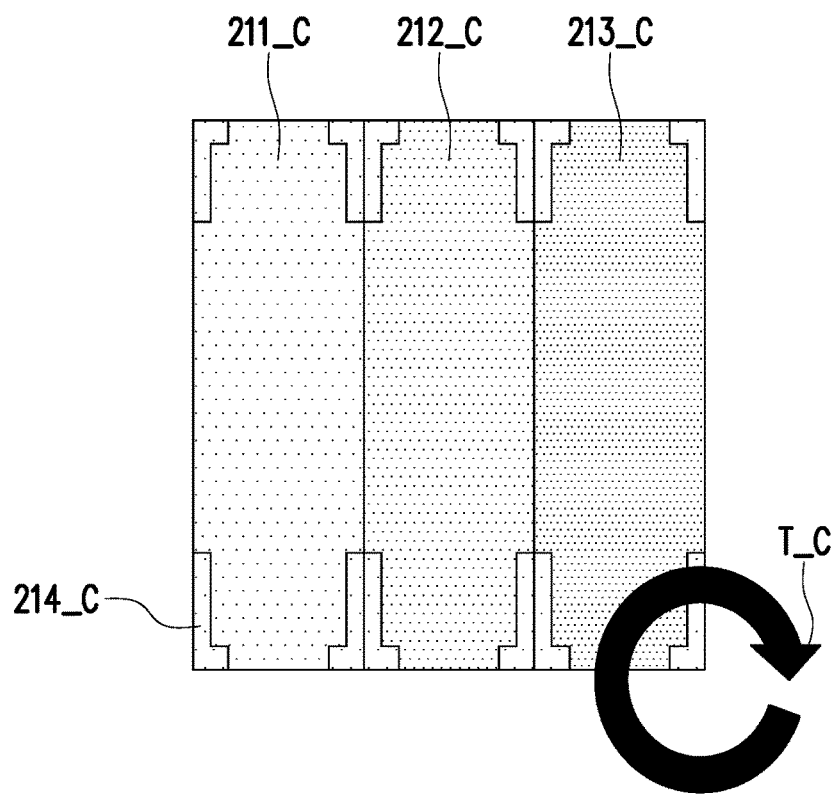

As shown in FIG. 3B, the actuator can make the display or the lens group move periodically on the plane along the circular trajectory T_C. The actuator can make the display 110 or the lens group 120 move on the plane with a frequency equal to an integer multiple of a frame frequency, so that the image of the sub-display area in the pixel is effectively reduced in the display screen. Besides, the controller may determine the radius of curvature of each part of the circular trajectory T_C according to the distance between two adjacent pixels in the display image, and make the first color image 211_C generated by the first color display area 211 can be enlarged; make the second color image 212_C generated by the second color display area 212 can be enlarged; and make the third color image 213_C generated by the third color display area 213 can be enlarged. In addition, the image generated by the non-display area 214 in the display image can be reduced, effectively reducing the screen door effect.

The circular trajectory T_C in the embodiment can be a perfect circular trajectory or an elliptical trajectory, and there is no certain limitation.

Figure 3C:
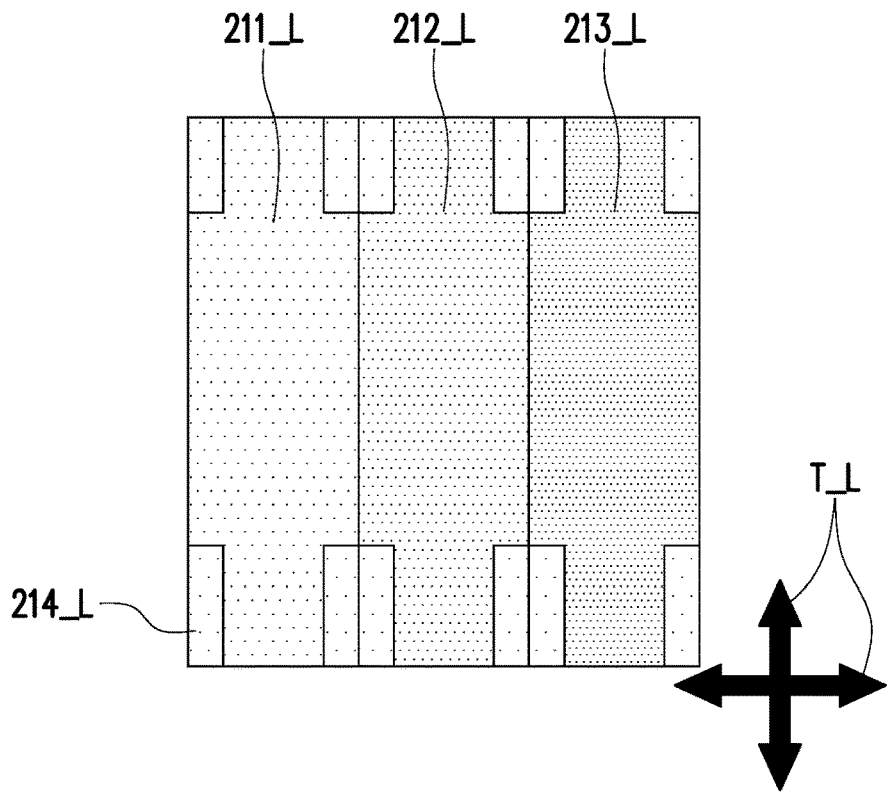

As shown in FIG. 3C, the actuator can make the display or the lens group move periodically on the plane along two straight-line trajectories T_L perpendicular to each other. The actuator can make the display 110 or the lens group 120 move on the plane with a frequency equal to an integer multiple of a frame frequency, so that the image of the sub-display area in the pixel is effectively reduced in the display screen. Besides, the controller will determine the respective lengths of the two straight-line trajectories T_L according to the distance between two adjacent pixels in the display image, and make the first color image 211_L generated by the first color display area 211 can be enlarged; make the second color image 212_L generated by the second color display area 212 can be enlarged; and make the third color image 213_L generated by the third color display area 213 can be enlarged. In addition, the image generated by the non-display area 214 in the display image can be reduced, effectively reducing the screen door effect.

Figure 3D:
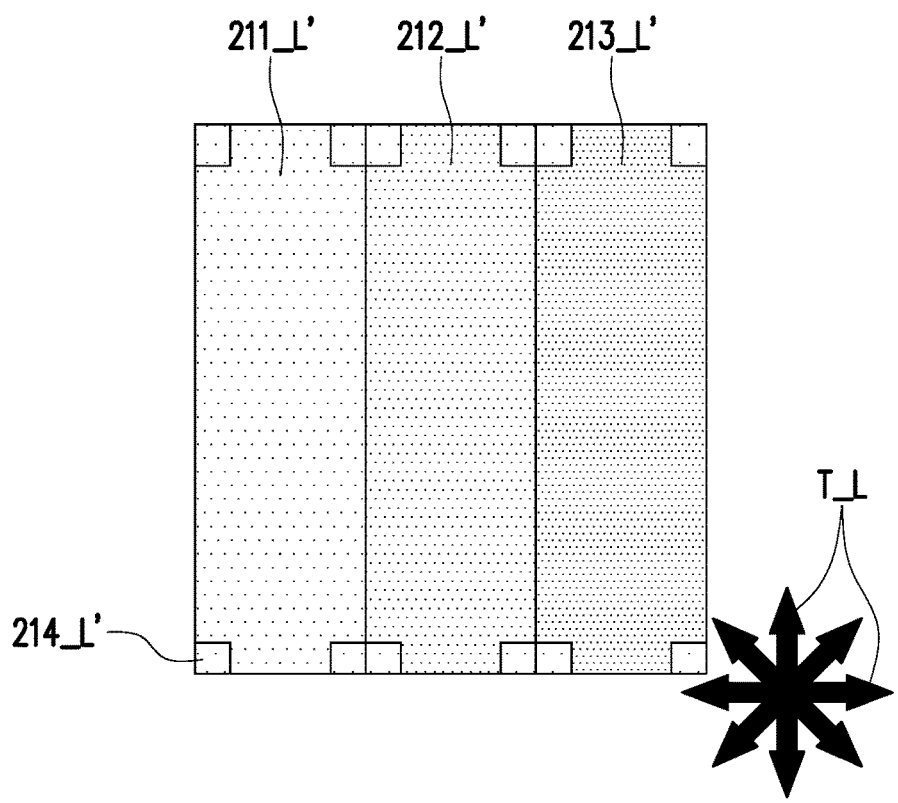

As shown in FIG. 3D, the actuator can make the display or the lens group move periodically on the plane along four straight-line trajectories T_L interlaced with each other, respectively in multiple directions (such as eight directions) along the pixels. The actuator 130 can make the display 110 or the lens group 120 move on the plane with a frequency equal to an integer multiple of a frame frequency, so that the image of the sub-display area in the pixel is effectively reduced in the display screen. Besides, the controller may determine the length of four straight-line trajectories T_L according to the distance between two adjacent pixels in the display image, and make the first color image 211_L' generated by the first color display area 211 can be enlarged; make the second color image 212_L' generated by the second color display area 212 can be enlarged; and make the third color image 213_L' generated by the third color display area 213 can be enlarged. In addition, the image generated by the non-display area 214 in the display image can be reduced, effectively reducing the screen door effect.

The lengths of the four straight-line trajectories T_L can be the same or different, and there is no certain limitation.

To sum up, in the head-mounted display device of the invention, the actuator makes the display or the lens group to move periodically on different trajectories on a plane, and the periodic movement is performed at a speed that completes at least one period in a frame period of the display. The amplitude of the periodic movement can make the display or the lens group periodically move on the plane, which can minimize the impact of the non-luminous area on the user's visual effect, and reduce the screen door effect.

Figure 4:
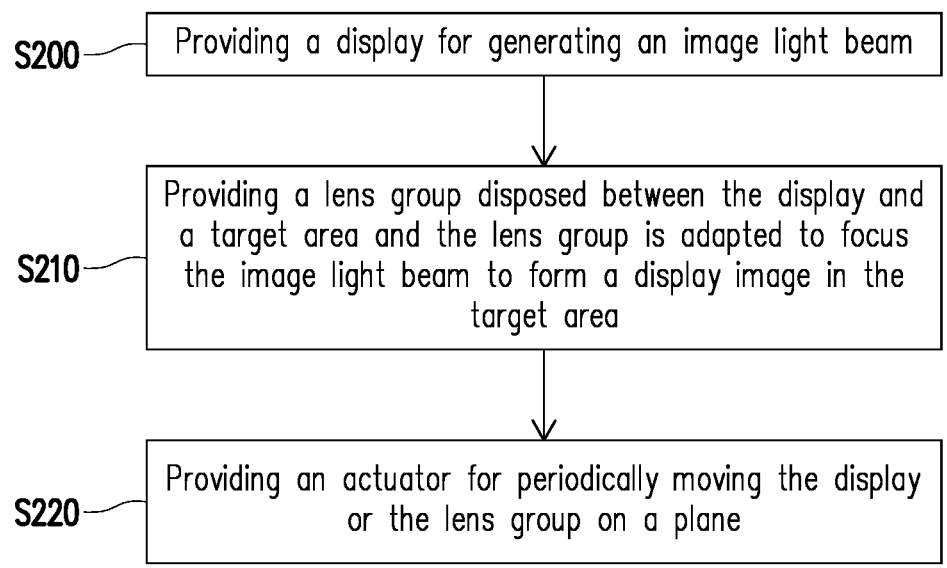
FIG. 4 is a flow chart of a display method according to an embodiment of the invention.

FIG. 4 is a flow chart of a display method according to an embodiment of the invention. In FIG. 4, Step S200 provides a display to generate an image light beam. In Step S210, a lens group is provided to be disposed on the display and a target area, so that the lens group focuses the image light beam to form a display image in the target area. And, in Step S220, an actuator is provided to periodically move the display or the lens group on a plane.

About the implementation details of above-mentioned steps, the foregoing embodiments have been described in detail, and will not be repeated here.

Although the present application has been disclosed as above with embodiments, it is not intended to limit the present application, any person with ordinary knowledge in the technical field, without departing from the spirit and scope of the present application, can make some changes. Therefore, the protection scope of the present application shall be determined by the scope of the claims.

What is claimed is:

1. A head-mounted display device, comprising:
   a display, used for generating an image light beam;
   a lens group, disposed between the display and a target area and adapted to focus the image light beam to form a display image in the target area; and
   an actuator, coupled to the display or the lens group to periodically move the display or the lens group on a plane, wherein the plane is parallel to a viewing plane of a user.

2. The head-mounted display device according to claim 1, wherein the actuator makes the display or the lens group move on the plane along a rectangular trajectory, a circular trajectory or multiple straight-line trajectories.

3. The head-mounted display device according to claim 1, wherein the actuator makes the display or the lens group complete at least one period of movement in a frame period of the display.

4. The head-mounted display device according to claim 1, wherein the actuator makes the display or the lens group move on the plane at a frequency that is a positive integer multiple of one frame frequency of the display.

5. The head-mounted display device according to claim 1, wherein the actuator makes the display or the lens group move on the plane with an amplitude determined by the distance between two adjacent pixels in the display.

6. The head-mounted display device according to claim 1, further comprises:
   a controller, coupled to the actuator, generates a driving signal to drive the actuator.

7. A display method for a head-mounted display device, comprising:
   providing a display for generating an image light beam;
   providing a lens group disposed between the display and a target area and the lens group is adapted to focus the image light beam to form a display image in the target area; and
   providing an actuator for periodically moving the display or the lens group on a plane, wherein the plane is parallel to a viewing plane of a user.

8. The display method according to claim 7, further comprises:
   providing the actuator to make the display or the lens group move on the plane along a rectangular trajectory, a circular trajectory or multiple straight-line trajectories.

9. The display method according to claim 7, further comprises:
   providing the actuator to make the display or the lens group complete at least one period of movement in a frame period of the display.

10. The display method according to claim 7, further comprises:
    providing the actuator to make the display or the lens group move on the plane at a frequency that is a positive integer multiple of a frame frequency of the display.

11. The display method according to claim 7, further comprises:
    determining an amplitude of the display or the lens group moving on the plane according to the distance between two adjacent pixels in the display.

12. The display method according to claim 7, further comprises:
    providing a controller to generate a driving signal to drive the actuator.

\* \* \* \* \*